US006998301B1

(12) United States Patent
Yu et al.

(10) Patent No.: US 6,998,301 B1
(45) Date of Patent: Feb. 14, 2006

(54) METHOD FOR FORMING A TRI-GATE MOSFET

(75) Inventors: Bin Yu, Cupertino, CA (US); Shibly S. Ahmed, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 141 days.

(21) Appl. No.: 10/653,225

(22) Filed: Sep. 3, 2003

(51) Int. Cl.
*H01L 21/00* (2006.01)
*H01L 21/84* (2006.01)

(52) U.S. Cl. ....................................... 438/157; 438/283

(58) Field of Classification Search ................ 438/151, 438/153, 154, 157, 279, 283
See application file for complete search history.

(56) References Cited

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "Sub-50 nm P-Channel FinFET," IEEE Transactions on Electron Devices, vol. 48, No. 5, May 2001, pp. 880-886.
Xuejue Huang et al., "Sub 50-nm FinFET: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.

*Primary Examiner*—Hoai Pham
*Assistant Examiner*—DiLinh Nguyen
(74) *Attorney, Agent, or Firm*—Harrity & Snyder LLP

(57) ABSTRACT

A method for forming a tri-gate semiconductor device that includes a substrate and a dielectric layer formed on the substrate includes depositing a first dielectric layer on the dielectric layer and etching the first dielectric layer to form a structure. The method further includes depositing a second dielectric layer over the structure, depositing an amorphous silicon layer over the second dielectric layer, etching the amorphous silicon layer to form amorphous silicon spacers, where the amorphous silicon spacers are disposed on opposite sides of the structure, depositing a metal layer on at least an upper surface of each of the amorphous silicon spacers, annealing the metal layer to convert the amorphous silicon spacers to crystalline silicon fin structures, removing a portion of the second dielectric layer, depositing a gate material, and etching the gate material to form three gates.

16 Claims, 16 Drawing Sheets

METHOD FOR FORMING A TRI-GATE MOSFET

FIELD OF THE INVENTION

The present invention relates generally to semiconductor manufacturing and, more particularly, to forming metal oxide semiconductor field effect transistor (MOSFET) devices.

BACKGROUND OF THE INVENTION

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar MOSFETs is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may also be fabricated using layout and process techniques similar to those used for conventional planar MOSFETs.

SUMMARY OF THE INVENTION

Implementations consistent with the principles of the invention provide a tri-gate MOSFET device that provides better short-channel control than double and single gate device designs.

In accordance with the purpose of this invention as embodied and broadly described herein, a method for forming a tri-gate semiconductor device that includes a substrate and a dielectric layer formed on the substrate includes depositing a first dielectric layer on the dielectric layer and etching the first dielectric layer to form a structure. The method further includes depositing a second dielectric layer over the structure, depositing an amorphous silicon layer over the second dielectric layer, etching the amorphous silicon layer to form amorphous silicon spacers, where the amorphous silicon spacers are disposed on opposite sides of the structure, depositing a metal layer on at least an upper surface of each of the amorphous silicon spacers, annealing the metal layer to convert the amorphous silicon spacers to crystalline silicon fin structures, removing a portion of the second dielectric layer, depositing a gate material, and etching the gate material to form three gates.

In another implementation consistent with the present invention, a method of manufacturing a semiconductor device that includes a substrate and a nitride layer formed on the substrate is disclosed. The method includes depositing a first silicon oxide layer on the nitride layer; etching the first silicon oxide layer to form a structure, where the structure includes at least a first side surface, a second side surface, and a top surface; depositing a second silicon oxide layer over the top surface and surrounding the first and second side surfaces of the structure; depositing an amorphous silicon layer over the second silicon oxide layer; etching the amorphous silicon layer to form amorphous silicon structures, where a first amorphous silicon structure is formed on a first side of the structure and a second amorphous silicon structure is formed on a second side of the structure; depositing a metal layer on at least an upper surface of each of the amorphous silicon structures; performing a metal-induced crystallization operation to convert the amorphous silicon structures to crystalline silicon structures; removing a portion of the second silicon oxide layer; forming a source region and a drain region; depositing a gate material over at least the crystalline silicon structures; and patterning and etching the gate material to form three gate electrodes.

In yet another implementation consistent with the principles of the invention, a semiconductor device is disclosed. The semiconductor device includes a structure comprising a dielectric material and including a first side and a second side; a first fin structure comprising a crystalline silicon material and being formed adjacent to the first side of the structure; a second fin structure comprising the crystalline silicon material and being formed adjacent to the second side of the structure; a source region formed at one end of the structure, the first fin structure, and the second fin structure; a drain region formed at an opposite end of the structure, the first fin structure, and the second fin structure; a first gate formed adjacent the first fin structure; a second gate formed adjacent the second fin structure; and a third gate formed above the first fin structure and the second fin structure.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide a tri-gate MOSFET device that provides better short-channel control than double and single gate device designs.

Exemplary Processing

Figure 1:
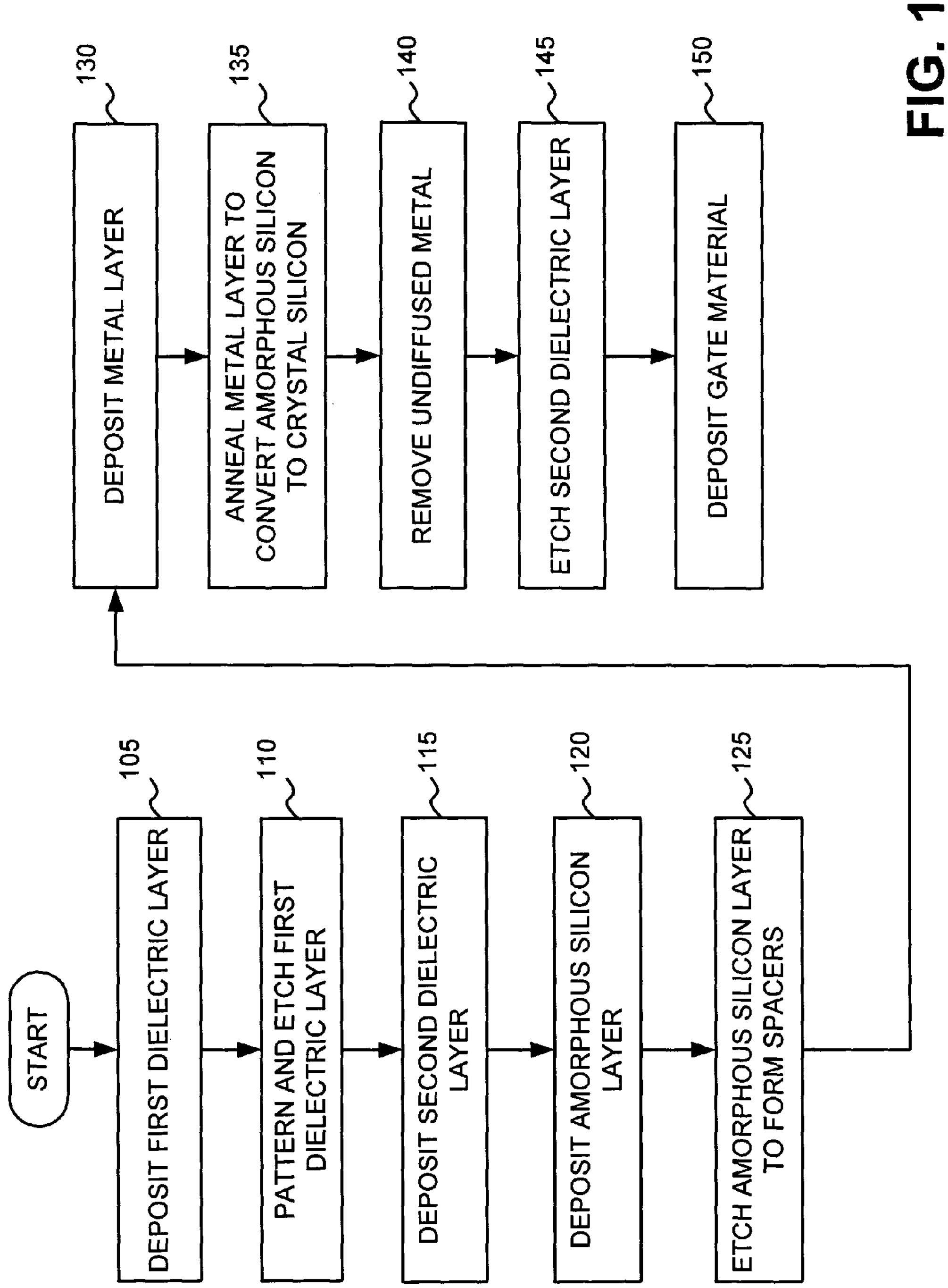
FIG. 1 illustrates an exemplary process for forming a tri-gate MOSFET device in an implementation consistent with the principles of the invention.

FIG. 1 illustrates an exemplary process for forming a MOSFET device in an implementation consistent with the principles of the invention. FIGS. 2–10 illustrate exemplary views of a MOSFET device fabricated according to the processing described in FIG. 1. The fabrication of one MOSFET device will be described hereinafter. It will be appreciated, however, that the techniques described herein are equally applicable to forming more than one MOSFET device.

Figure 2:
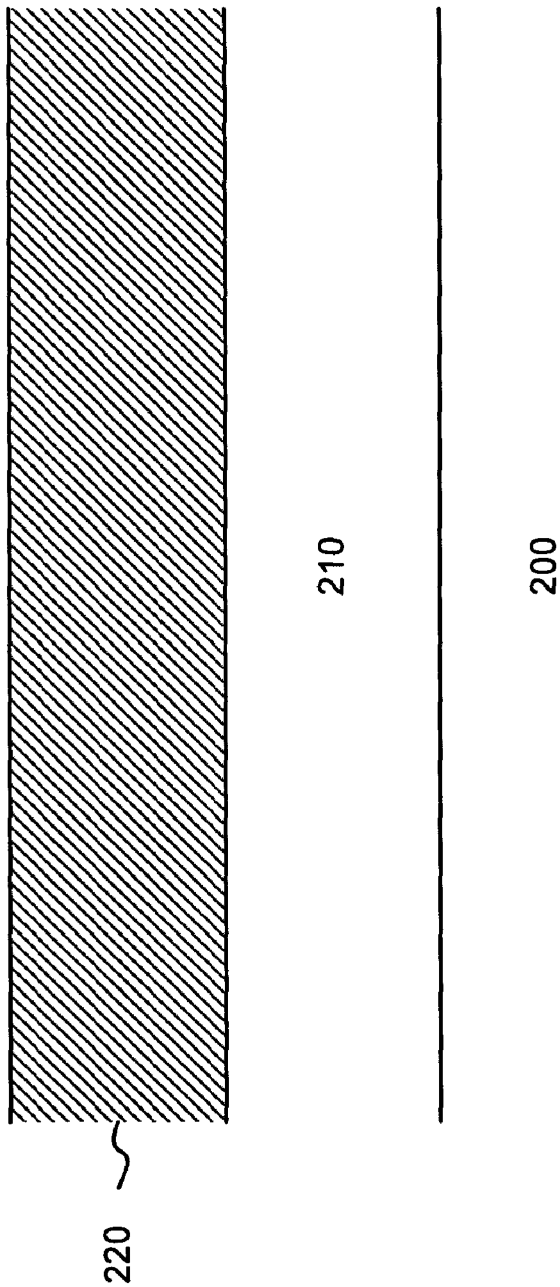
FIGS. 2–10 illustrate exemplary views of a MOSFET device fabricated according to the processing described in FIG. 1.

With reference to FIGS. 1 and 2, processing may begin with a semiconductor device that includes a substrate 200 and a nitride layer 210 formed on substrate 200. In one implementation, substrate 200 may comprise silicon or other semiconducting materials, such as germanium, or combinations of semiconducting materials, such as silicon-germanium. Nitride layer 210 may be formed on substrate 200 to a thickness ranging from about 300 Å to about 1000 Å. In alternative implementations, layer 210 may include other dielectric materials.

A dielectric layer 220, such as a silicon oxide layer, may be formed over nitride layer 210 (act 105). In one implementation, dielectric layer 220 may comprise $SiO_2$ and may be deposited using chemical vapor deposition (CVD) to a thickness ranging from about 600 Å to about 1000 Å. In other implementations consistent with the present invention, layer 220 may consist of other films or materials that may be deposited or grown, including conductive materials or other non-conductive materials.

Figure 3:
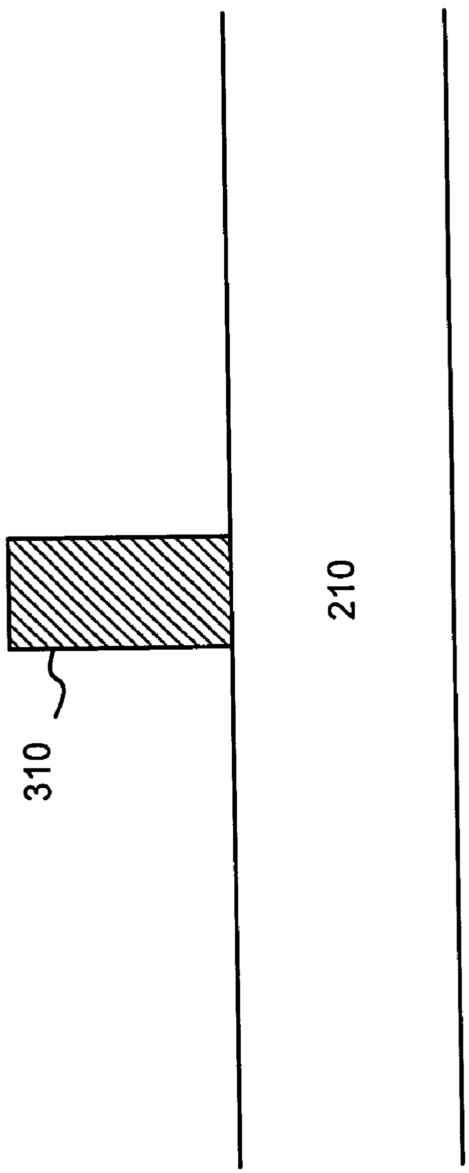

$SiO_2$ layer 220 may be patterned and etched to form $SiO_2$ structure 310, as illustrated in FIG. 3 (act 110). For example, to form $SiO_2$ structure 310, a mask may be formed over a portion of dielectric layer 220 and dielectric layer 220 may then be etched in a conventional manner, with the etching terminating on nitride layer 210 to form $SiO_2$ structure 310. The resulting $SiO_2$ structure 310 may have a width ranging from about 500 Å to about 2000 Å.

Figure 4:
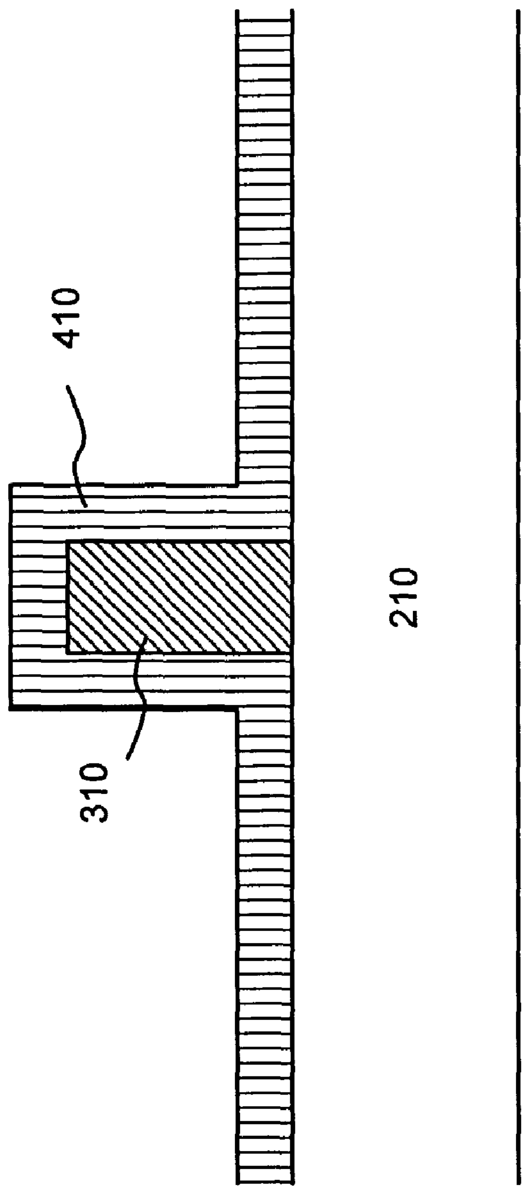

A second dielectric layer 410 may then be formed on the semiconductor device, as illustrated in FIG. 4 (act 115). In one implementation, second dielectric layer 410 may comprise $SiO_2$ and may be deposited using CVD to a thickness ranging from about 200 Å to about 300 Å. In other implementations consistent with the present invention, layer 410 may consist of other films or materials that may be deposited or grown, including conductive materials or other non-conductive materials.

Figure 5:
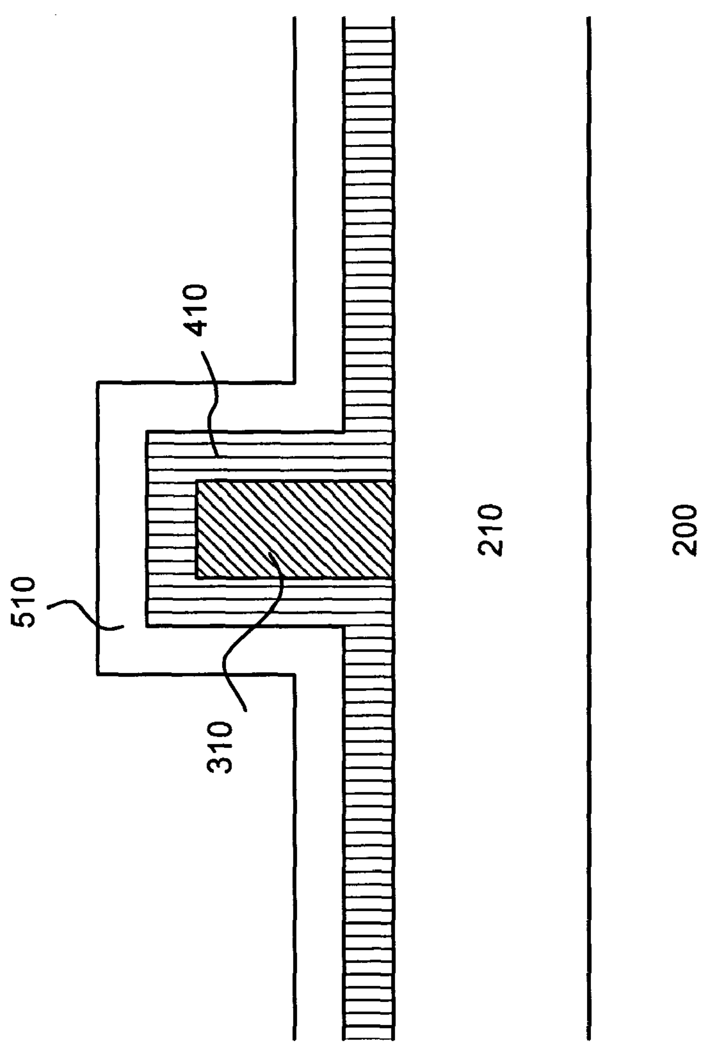
Figure 6:
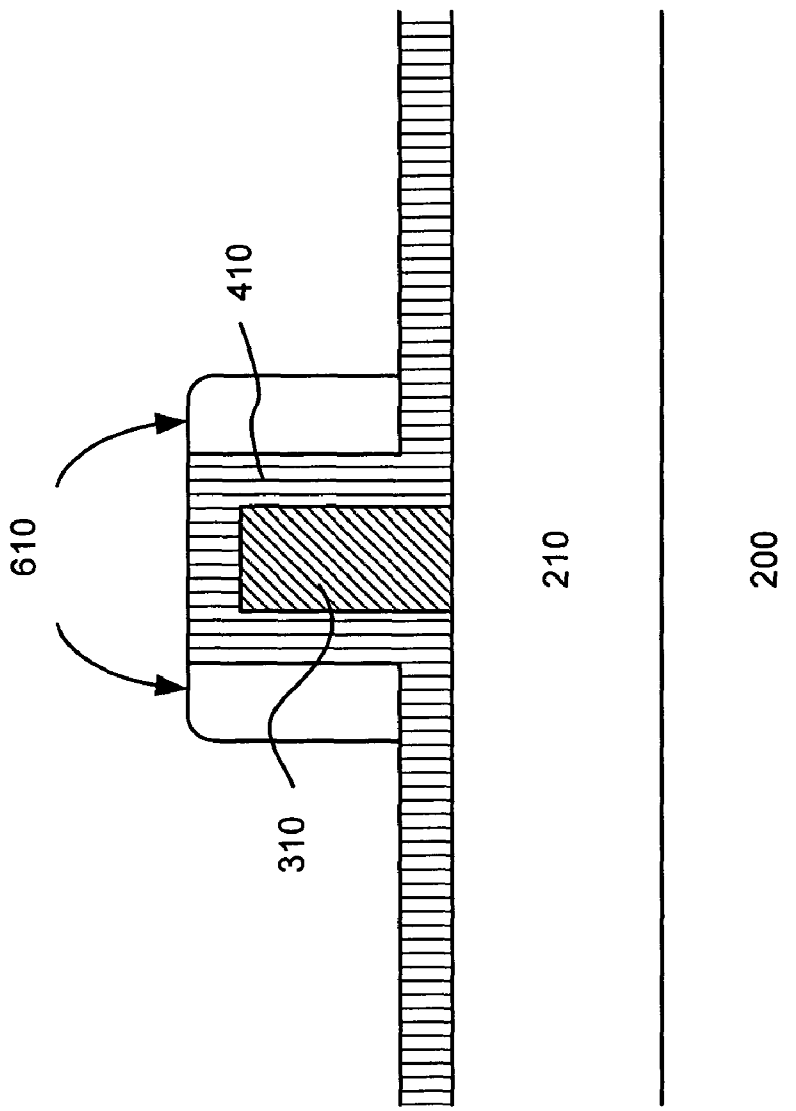

An amorphous silicon layer 510 may be formed over second $SiO_2$ layer 410, as illustrated in FIG. 5 (act 120). In one implementation, amorphous silicon layer 510 may be deposited to a thickness ranging from about 150 Å to about 300 Å. Amorphous silicon layer 510 may then be patterned and etched to form spacers 610, as illustrated in FIG. 6 (act 125). As illustrated, spacers 610 are formed on opposite sides of $SiO_2$ structure 310. The width of each spacer 610 may range from about 50 Å to about 200 Å.

Figure 7:
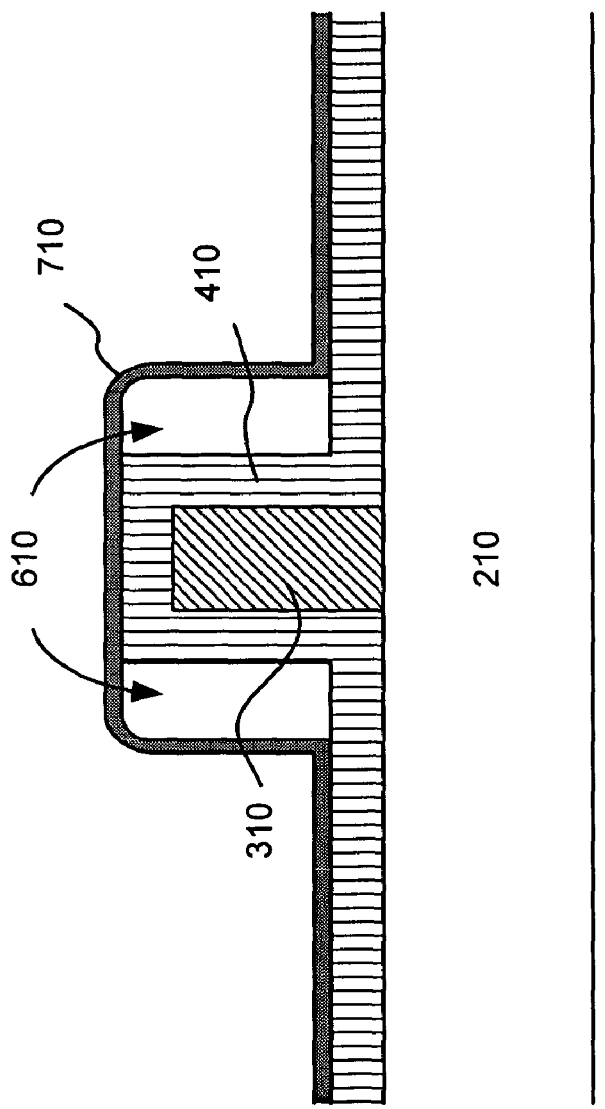

A metal layer 710, such as nickel, may be deposited on the semiconductor device, as illustrated in FIG. 7 (act 130). In one implementation, nickel layer 710 may be deposited to a thickness of about 20 Å to about 30 Å.

Figure 8:
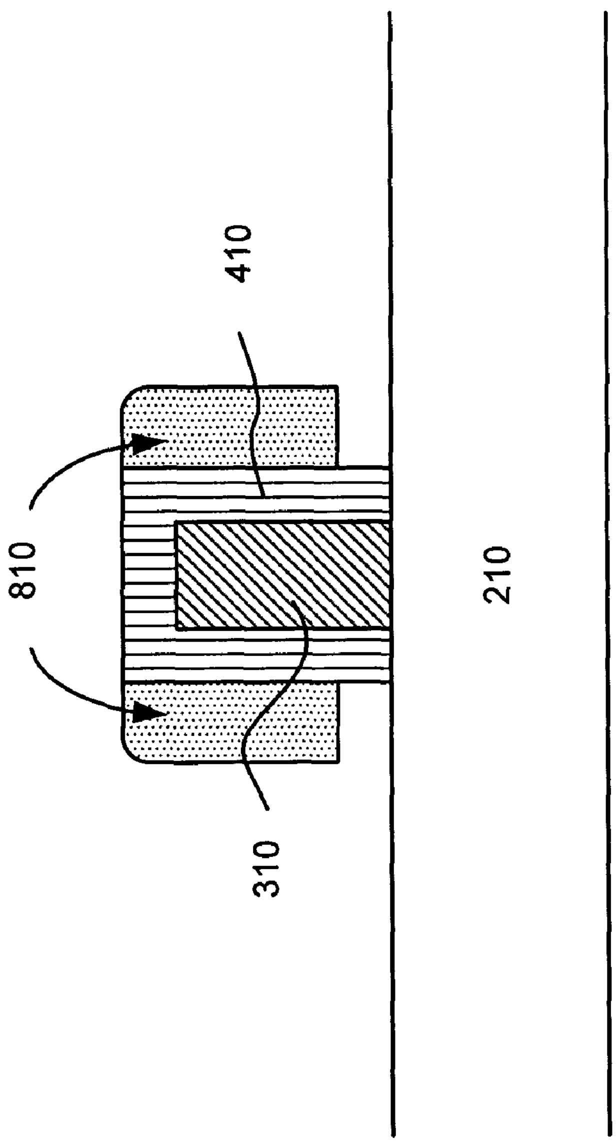

A metal-induced crystallization (MIC) operation may be performed. The MIC operation may include annealing nickel layer 710 at about 500° C. to about 550° C. for several hours, which acts to diffuse the nickel into the amorphous silicon of spacers 610 and to convert the amorphous silicon in spacers 610 to single-crystal or polycrystalline silicon fin structures 810, as illustrated in FIG. 8 (act 135). In one implementation, the annealing occurs for about 1 to 5 hours. Undiffused portions of nickel layer 710 may be removed from the semiconductor device (act 140). The undiffused portions may be removed via etching or other well-known techniques.

Portions of second $SiO_2$ layer 410 may then be removed, resulting in the configuration illustrated in FIG. 8 (act 145). In one implementation, the portions of second $SiO_2$ layer 410 located below fin structures 810 and on nitride layer 210 may be removed using a wet etch chemistry. The particular etchant(s) associated with etching second $SiO_2$ layer 410 may be optimized based on the particular end device requirements. Once removed, a gap exits between fin structures 810 and nitride layer 210. In one implementation, the gap may range from about 100 Å to about 500 Å.

A gate dielectric layer (not shown) may optionally be deposited or thermally grown on crystalline silicon fin structures 810. The gate dielectric layer may be formed at a thickness ranging from approximately 5 Å to 30 Å. The gate dielectric layer may include conventional dielectric materials, such as an oxide (e.g., silicon dioxide). In other implementations, a nitride material, such as a silicon nitride, may be used as the gate dielectric material.

Figure 9:
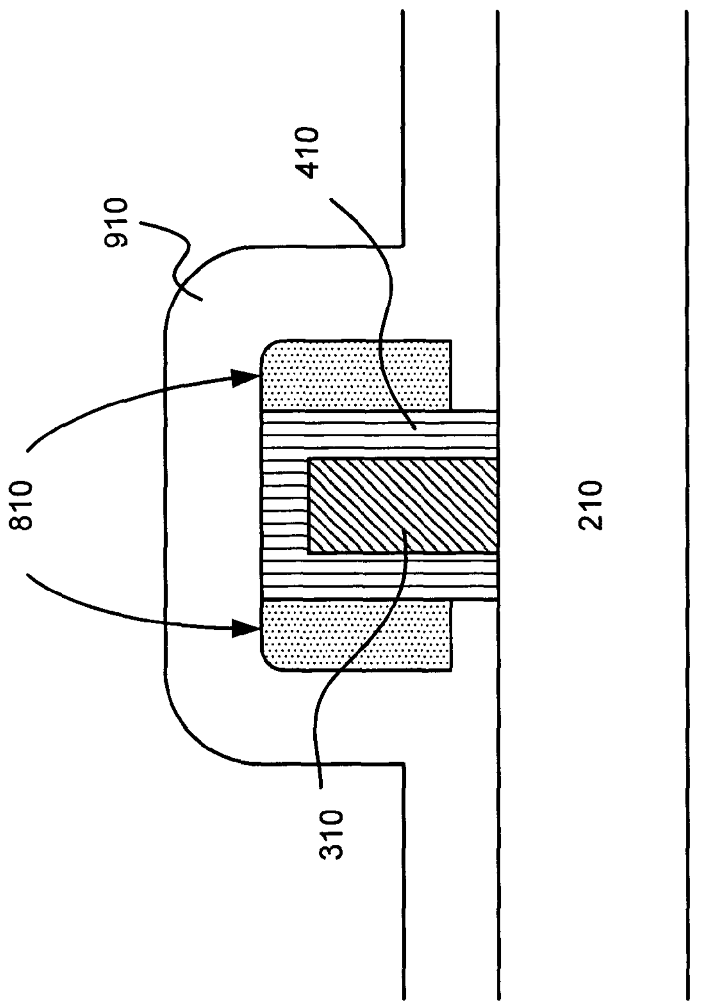

A gate material layer 910 may then be deposited and etched to form one or more gate electrodes, as illustrated in FIG. 9 (act 150). In an exemplary implementation, gate material layer 910 may include polysilicon deposited using conventional CVD to a thickness ranging from about 200 Å to about 1000 Å. Alternatively, other semiconducting materials, such as germanium or combinations of silicon and germanium, or various metals may be used as the gate material. In one implementation, gate material layer 910 is patterned and etched to form three gate electrodes. First and second gate electrodes may be located on opposite sides adjacent the respective fin structures 810 and a third gate electrode may be located above fin structures 810.

Figure 10:
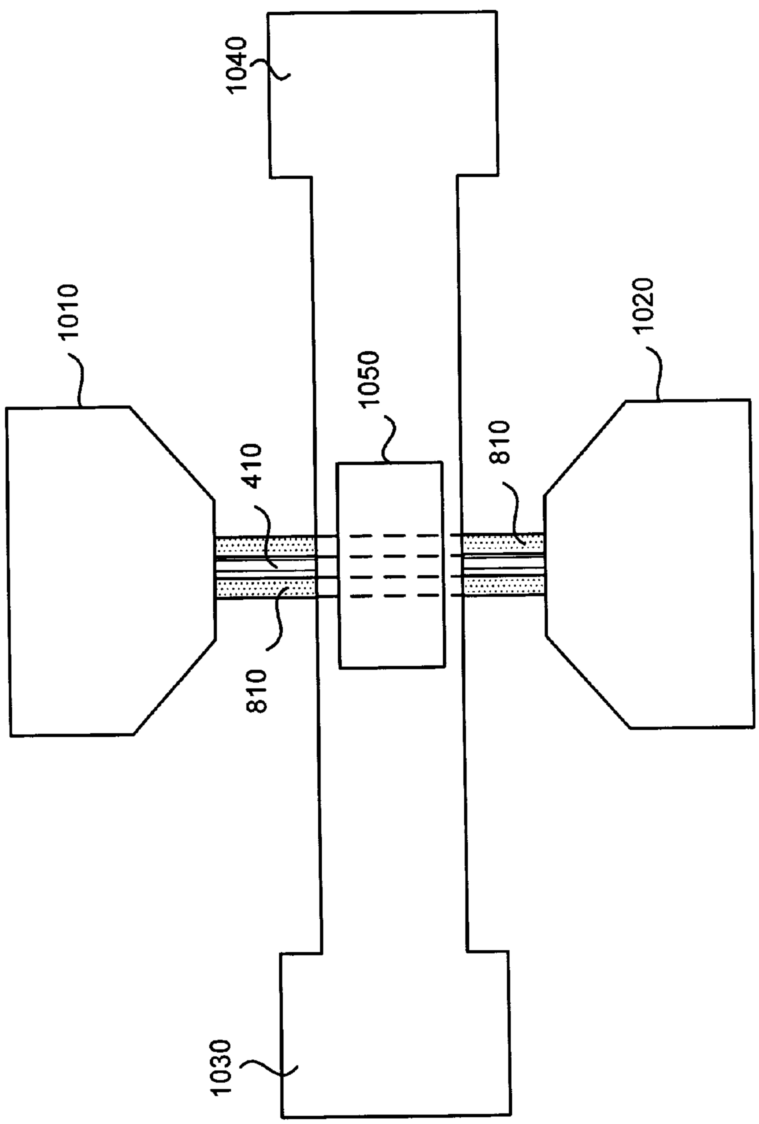

Source/drain regions may be formed at the respective ends of fins 810. It should be understood that in some implementations, source/drain regions may be formed at an earlier processing step. FIG. 10 illustrates an exemplary top view of the semiconductor device consistent with the principles of the invention after the source/drain regions and gate electrodes are formed. As illustrated, the semiconductor device includes a triple-gate structure with fins 810, source and drain regions 1010 and 1020, and gate electrodes 1030, 1040, and 1050. Any one of gate electrodes 1030, 1040, and 1050 may be used to bias the semiconductor device during circuit operations.

Source/drain regions 1010 and 1020 may then be doped with n-type or p-type impurities based on the particular end device requirements. In addition, sidewall spacers may optionally be formed prior to the source/drain ion implantation to control the location of the source/drain junctions based on the particular circuit requirements. Activation annealing may then be performed to activate source/drain regions 1010 and 1020.

The present invention has been described above as forming a tri-gate MOSFET with a number of fin structures. It should be understood that implementations consistent with the present invention may be used to form double or tri-gate devices with other numbers of fins, based on the particular circuit requirements.

Thus, in accordance with the principles of the invention, a tri-gate MOSFET device may be formed, providing better short-channel control than double and single gate devices. Also, the tri-gate MOSFET may have higher drive current than double-gate devices for the same gate area.

Other Implementations

Figure 11:
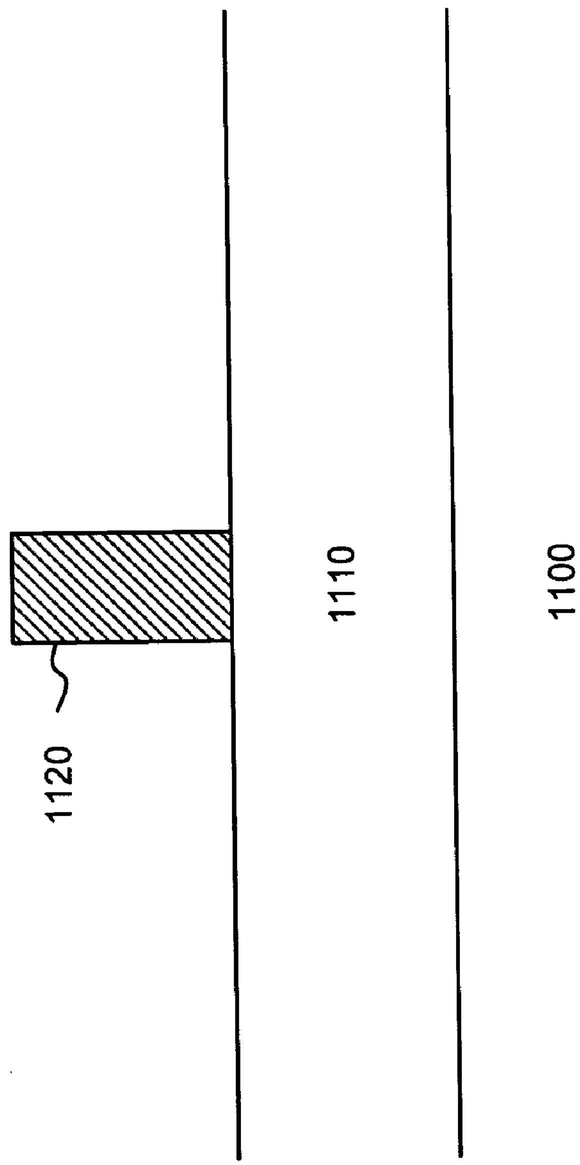
FIGS. 11–14 illustrate exemplary views for improving gate patterning in an alternative implementation consistent with the principles of the invention.

An alternative implementation is directed to improving gate patterning through the use of metal spacers. FIGS. 11–14 illustrate exemplary views for forming a FinFET device in an alternative implementation consistent with the principles of the invention. With reference to FIG. 11, the semiconductor device may include a silicon on insulator (SOI) structure with a buried oxide layer 1110 formed on a substrate 1100 and a silicon fin structure 1120 formed on buried oxide layer 1110. Silicon fin structure 1120 may be formed via conventional techniques. For example, a photoresist material may be deposited and patterned to form a photoresist mask. The silicon layer may then be etched in a conventional manner, with the etching terminating on buried oxide layer 1110, to form silicon fin structure 1120.

Figure 12:
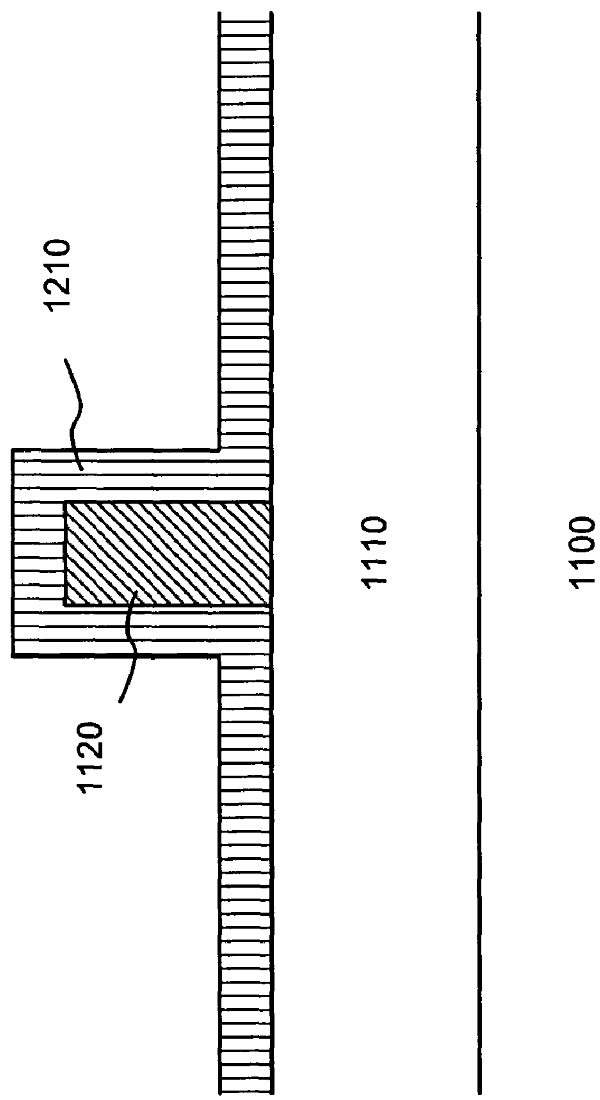

A metal layer 1210 may then be deposited on the semiconductor device, as illustrated in FIG. 12. In one implementation, the metal layer 1210 may comprise tungsten, titanium, tantalum, or nickel. Other metals may alternatively be used.

Figure 13:
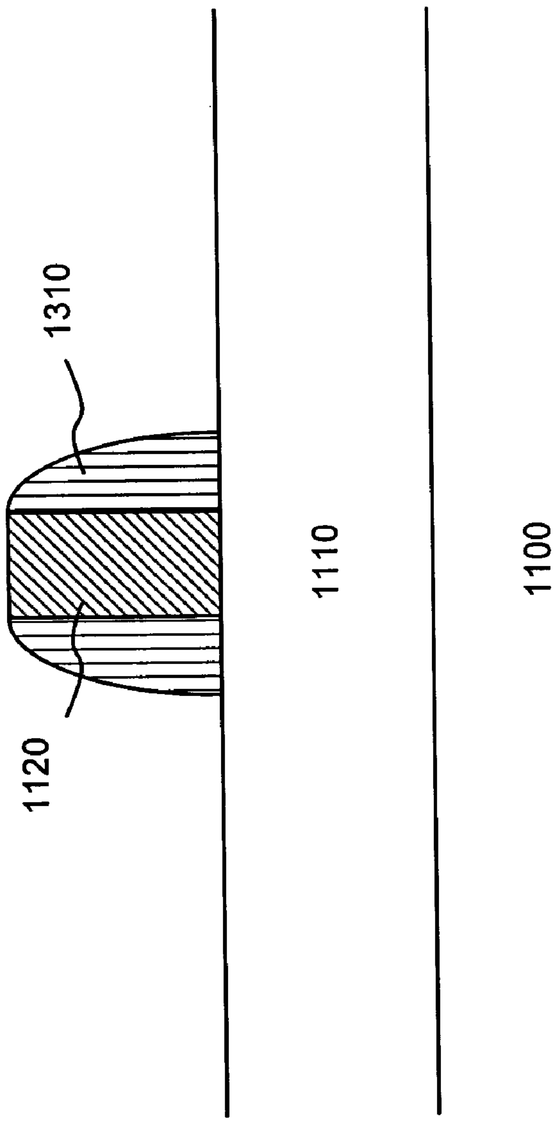
Figure 14:
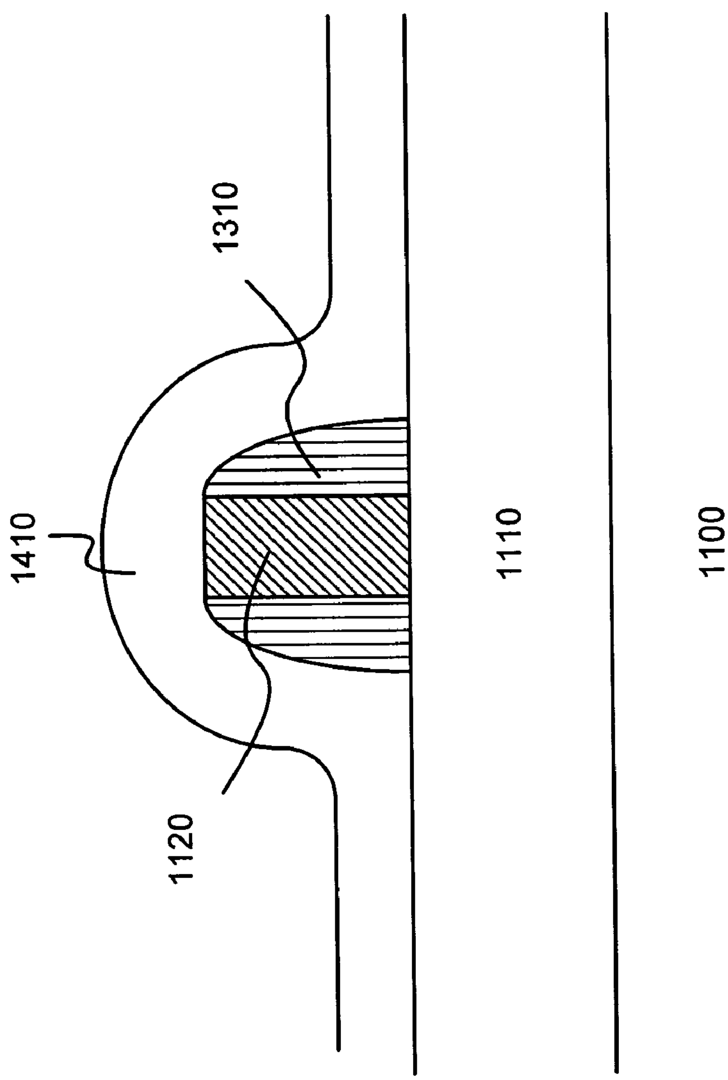

Metal layer 1210 may then be patterned and etched to form spacers 1310, as illustrated in FIG. 13. As illustrated, spacers 1310 are formed on opposite sides of silicon fin structure 1120. A gate material layer 1410 may then be deposited to form one or more gate electrodes, as illustrated in FIG. 14. In an exemplary implementation, gate material layer 1410 may include polysilicon deposited using conventional CVD. Alternatively, other semiconducting materials, such as germanium or combinations of silicon and germanium, or various metals may be used as the gate material. The gate material layer 1410 may then be patterned and etched to form gate electrodes. Metal spacers 1310 act to reduce the fin step height during gate patterning, thereby improving gate patterning.

Figure 15:
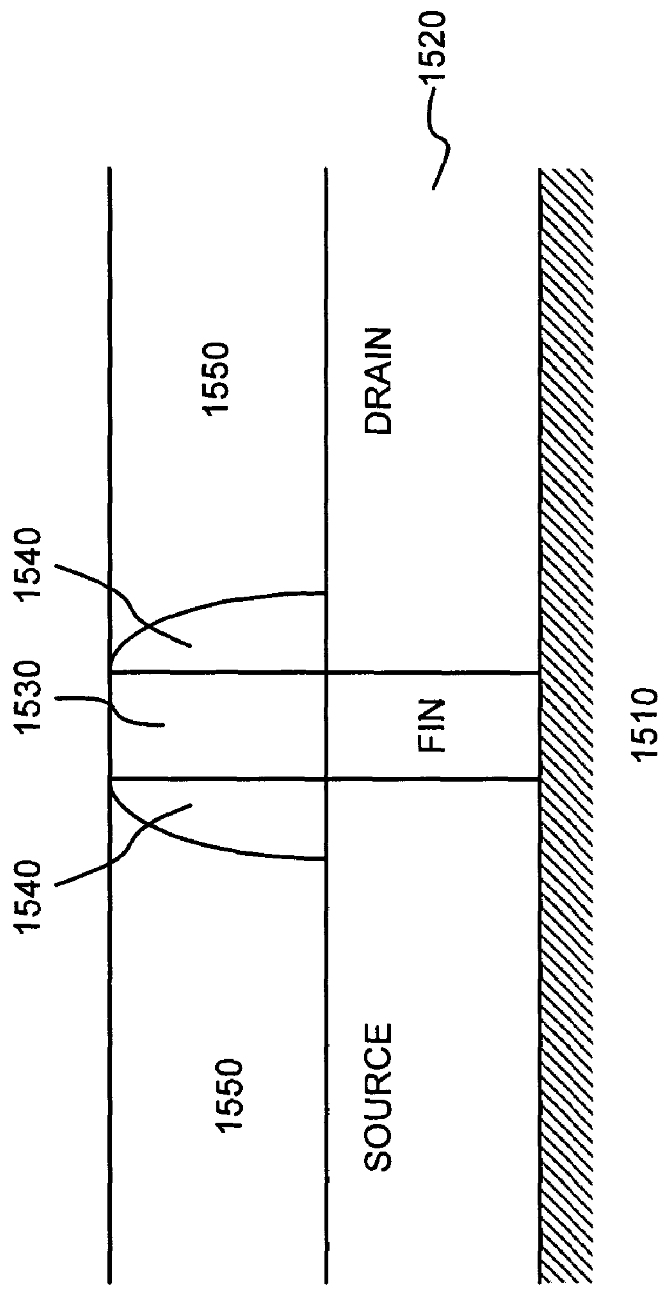
FIGS. 15 and 16 illustrate exemplary views for performing gate filling according to an alternative implementation consistent with the principles of the invention.

In another implementation, an alternative filling material may be used in fabricating a damascene gate MOSFET. As illustrated in FIG. 15, a semiconductor device may include an oxide layer 1510 formed on a substrate (not shown) with a silicon layer 1520 formed thereon. A dummy polysilicon gate 1530 may be formed on silicon layer 1520. A spacer material, such as a silicon oxide (e.g., $SiO_2$), may be deposited and etched to form spacers 1540 on the side surfaces of dummy polysilicon gate 1530. An organic material 1550 may then be deposited and planarized to expose the top surface of dummy polysilicon gate 1530.

Figure 16:
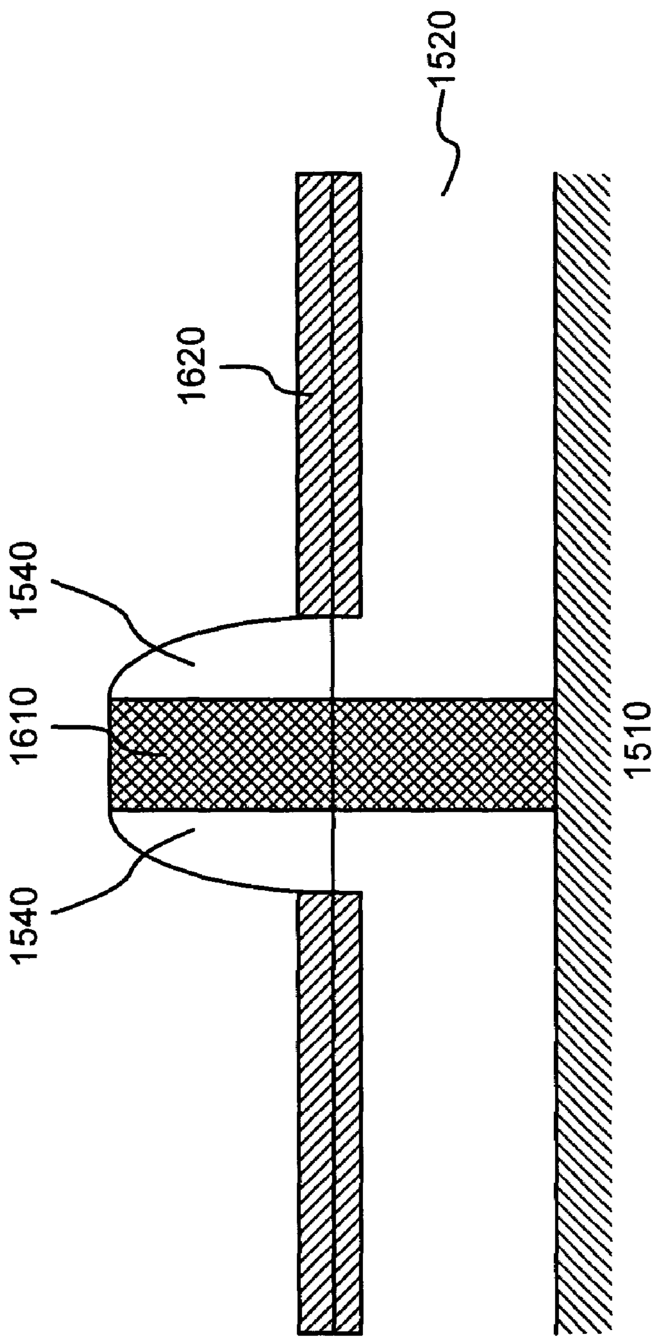

Dummy polysilicon gate 1530 may then be removed. A metal gate 1610 may then be deposited and polished, as illustrated in FIG. 16. The metal may include, for example, tungsten, tantalum nitride, tantalum silicon nitride, titanium, or nickel. Other metals may alternatively be used. Organic material 1550 may then be removed and the source and drain regions may be silicided 1620. In one implementation, silicide 1620 may be NiSi or $CoSi_2$.

CONCLUSION

Implementations consistent with the principles of the invention provide a tri-gate MOSFET device that provides better short-channel control than double and single gate device designs.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also as used herein, the article "a" is intended to include one or more items. Where only one item is intended, the term "one" or similar language is used.

The scope of the invention is defined by the claims and their equivalents.

What is claimed is:

1. A method for forming a tri-gate semiconductor device that includes a substrate and a dielectric layer formed on the substrate, comprising:
- depositing a first dielectric layer on the dielectric layer;
- etching the first dielectric layer to form a structure;
- depositing a second dielectric layer over the structure;
- depositing an amorphous silicon layer over the second dielectric layer;
- etching the amorphous silicon layer to form amorphous silicon spacers, the amorphous silicon spacers being disposed on opposite sides of the structure;
- depositing a metal layer on at least an upper surface of each of the amorphous silicon spacers;
- annealing the metal layer to convert the amorphous silicon spacers to crystalline silicon fin structures;
- removing a portion of the second dielectric layer;
- depositing a gate material; and
- etching the gate material to form tri-gate semiconductor.

2. The method of claim 1 wherein the depositing a first dielectric layer includes:
- depositing the first dielectric layer to a thickness ranging from about 600 Å to about 1000 Å.

3. The method of claim 1 wherein the first dielectric layer comprises silicon dioxide.

4. The method of claim 1 wherein a width of the structure ranges from about 500 Å to about 2000 Å.

5. The method of claim 1 wherein the depositing a second dielectric layer includes:
- depositing the second dielectric layer to a thickness ranging from about 200 Å to about 300 Å.

6. The method of claim 5 wherein the first and second dielectric layers comprise silicon dioxide.

7. The method of claim 1 wherein the depositing an amorphous silicon layer includes:
- depositing the amorphous silicon layer to a thickness ranging from about 150 Å to about 300 Å.

8. The method of claim 1 wherein a width of each of the amorphous silicon spacers ranges from about 50 Å to about 200 Å.

9. The method of claim 1 wherein the depositing a metal layer includes:

depositing a nickel layer to a thickness ranging from about 20 Å to about 30 Å.

10. The method of claim 1 wherein the annealing includes:

annealing the metal layer at a temperature of about 500° C. to about 550° C.

11. The method of claim 1 wherein the depositing a gate material includes:

depositing a polysilicon layer to a thickness ranging from about 200 Å to about 1000 Å.

12. A method of manufacturing a semiconductor device that includes a substrate and a nitride layer formed on the substrate, the method comprising:

depositing a first silicon oxide layer on the nitride layer;

etching the first silicon oxide layer to form a structure, the structure having at least a first side surface, a second side surface, and a top surface;

depositing a second silicon oxide layer over the top surface and surrounding the first and second side surfaces of the structure;

depositing an amorphous silicon layer over the second silicon oxide layer;

etching the amorphous silicon layer to form amorphous silicon structures, a first amorphous silicon structure being formed on a first side of the structure and a second amorphous silicon structure being formed on a second side of the structure;

depositing a metal layer on at least an upper surface of each of the amorphous silicon structures;

performing a metal-induced crystallization operation to convert the amorphous silicon structures to crystalline silicon structures;

removing a portion of the second silicon oxide layer;

forming a source region and a drain region;

depositing a gate material over at least the crystalline silicon structures; and patterning and etching the gate material to form tri-gate electrodes semiconductor devise.

13. The method of claim 12 wherein the depositing a second silicon dioxide layer includes:

depositing the second silicon dioxide layer to a thickness ranging from about 200 Å to about 300 Å.

14. The method of claim 12 wherein the depositing an amorphous silicon layer includes:

depositing the amorphous silicon layer to a thickness ranging from about 150 Å to about 300 Å.

15. The method of claim 14 wherein a width of each of the amorphous silicon spacers ranges from about 50 Å to about 200 Å.

16. The method of claim 12 wherein the performing a metal-induced crystallization operation includes:

annealing the metal layer at a temperature of about 500° C. to about 550° C.

* * * * *